(12) United States Patent
Higuchi et al.

(10) Patent No.: US 6,437,412 B1
(45) Date of Patent: Aug. 20, 2002

(54) SURFACE ACOUSTIC WAVE DEVICE HAVING A PACKAGE INCLUDING A CONDUCTIVE CAP THAT IS COATED WITH SEALING MATERIAL

(75) Inventors: Masato Higuchi, Kusatsu; Atsushi Hirakawa, Kanazawa; Shinobu Uesugi; Koichi Kanryo, both of Omihachiman, all of (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 09/592,517

(22) Filed: Jun. 12, 2000

(30) Foreign Application Priority Data

Jun. 17, 1999 (JP) .......................... 11-170960

(51) Int. Cl.⁷ ................................. H03H 9/25
(52) U.S. Cl. .................. 257/416; 257/678; 257/704
(58) Field of Search ................. 257/678, 704, 257/416; 310/313 R

(56) References Cited

U.S. PATENT DOCUMENTS 5,594,979 A * 1/1997 Borchelt et al.
6,119,920 A * 9/2000 Guthrie et al.

FOREIGN PATENT DOCUMENTS

| GB | 2 058 506 A | * 4/1981 |
| JP | 2-283112 | 11/1990 |
| JP | 6-132762 | 5/1994 |
| JP | 9-162686 A | * 6/1997 |

OTHER PUBLICATIONS

Kazunori Nishimura, "Surface Acoustic Wave Device," English translation of Japanese published application No. JP 9–162686 A, Jun. 1997.*

J. Gore et al., "Low–Cost Surface Mount Packaging for SAWs," IEEE Proceedings of the Ultrasonics Symposium, 1992, pp. 129–138.*

* cited by examiner

*Primary Examiner*—Keith Christianson
*Assistant Examiner*—Stephen W. Smoot
(74) *Attorney, Agent, or Firm*—Keating & Bennett, LLP

(57) ABSTRACT

A surface acoustic wave device includes a surface acoustic wave element and a package. The package has a base member and a conductive cap member which are joined together by a sealing material so as to hermetically seal the surface acoustic wave element therein. The conductive cap member is coated with the sealing material on the entire surface thereof that is disposed opposite to the base member.

10 Claims, 2 Drawing Sheets

SURFACE ACOUSTIC WAVE DEVICE HAVING A PACKAGE INCLUDING A CONDUCTIVE CAP THAT IS COATED WITH SEALING MATERIAL

BACKGROUND OF THE INVENTION

1. Field of the Invention

The present invention relates to a surface acoustic wave device including a surface acoustic wave element hermetically sealed in a package including a base member and a conductive cap member joined together by a sealing material.

2. Description of the Related Art

A conventional surface acoustic wave device includes, for example, as shown in FIG. 3, a concave base member 1 made of a ceramic such as alumina, and a surface acoustic wave element 2 bonded and fixed to the base member 1 by an adhesive (e.g. via die bonding). Certain electrodes of the surface acoustic wave element 2 and certain electrodes of the base member 1 are connected to each other through bonding wires 5, then the base member 1 and a cap member 3 are joined by a sealing material 7, such as a resin adhesive, a solder, or a glass, whereby the surface acoustic wave element 2 is hermetically sealed in a package defined by the base member 1 and the cap member 3. The surface acoustic wave element is provided with microscopic electrodes (not shown) defining an IDT on the surface thereof disposed across a gap of several $\mu$m or several tens of $\mu$m between each electrode.

In the surface acoustic wave device of this type, the surface acoustic wave element must be hermetically sealed so that moisture or the like is prevented from penetrating the package in order to prevent deterioration of the characteristics of the surface acoustic wave element.

Also, in this type of device, a conductive cap member is used as the cap member 3. The conductive cap member is made of a punched metallic plate or an insulating material such as a ceramic and is processed to be conductive by, for example, plating.

In this prior art method, the base member 1 and the cap member 3 are joined in a manner such that the sealing material 7 is formed to have a frame-shape by a method such as printing on the joining portion of either the base member 1 or the cap member 3, and the sealing material 7 is cured or melted.

However, in the above-described known surface acoustic wave device, a problem has been discovered in that, as a result of the sealing material being formed to have a frame-shape at the peripheries of the base member and the cap member, metallic particles, such as punched-out particles or scraps, adhered to the cap member when the cap member is punched or processed to be conductive, drop on the surface of the surface acoustic wave element while the base member and the cap member are joined, or in subsequent processes or while being used, thereby deteriorating the characteristics thereof.

Another problem has been discovered in that the required air-tightness cannot be sufficiently and reliably achieved because the length of paths of moisture from the outside to the inside of the package is the same as only the width of the sealing material, the passages being formed either through the joining interfaces between the sealing material and each of the members or through the sealing material itself, and because the joining interfaces are exposed inside of the internal space.

A further problem has been discovered in that inadequate joining, such as lack of adhesive strength or decreased air-tightness, occurs due to the lack of the sealing material for sealing gaps when the gaps are formed between the base member and the cap member because of particles adhered at the joining portion thereof or because scratches on the base member and the cap member.

SUMMARY OF THE INVENTION

To overcome the problems described above, preferred embodiments of the present invention provide a surface acoustic wave device in which metallic particles adhered to a conductive cap member are prevented from adhering to a surface acoustic wave element.

In order to achieve these and other advantages, a preferred embodiment of the present invention provides a surface acoustic wave device which includes a surface acoustic wave element and a package. The package has a base member and a conductive cap member which are joined together by a sealing material so that the surface acoustic wave element is hermetically sealed in the package. The sealing material is provided on the entire surface of the conductive cap member that is disposed opposite to the base member.

A material, such as a resin adhesive, a solder, a gold-tin (Au—Sn) alloy, or a glass, is preferably used as the sealing material. A resin adhesive is preferably used so as to facilitate coating and joining processes. In particular, an epoxy-based resin adhesive having high density is preferably used in order to obtain a high level of air-tightness and a sufficient adhesive strength.

With this configuration, the conductive cap member is coated in advance with the sealing material on the entire surface thereof that is disposed opposite to the base member, whereby metallic particles such as punched-out particles and scraps adhered to the conductive cap member in the manufacturing process are fixed to the sealing material. Therefore, the metallic particles are not adhered to the surface of the surface acoustic wave element when both members are joined, nor in subsequent processes or while being used, thereby avoiding deterioration of the characteristics or occurrence of deteriorated characteristics due to the metallic particles adhering to the surface acoustic wave element.

One of the joining interfaces of the sealing material which define penetrating paths of outside air (moisture, gases, etc.), which is the joining interface of the sealing material with the cap member, is not exposed inside the package, and the length of paths, that is, the joining interface of the sealing material with the base member and the length of paths through the sealing material itself are increased in size to be relatively large. As a result, the penetration of the outside air, which penetrates from the outside to the inside, is greatly reduced and air-tightness is greatly improved. The effect of prevention of the outside air from penetrating is particularly remarkable when using a resin adhesive through which the outside air penetrates more than through other sealing materials such as a solder and glass.

Inadequate joining due to lack of adhesive strength, decreased air-tightness, or other such conditions does not occur when gaps are produced between the base member and the cap member by foreign particles adhered at the joining portion or scratches formed on the base member or the cap member, because, in this case, the sealing material adhered (coated) toward the inside from the joining portion is supplied to the joining portion.

The surface acoustic wave device according to preferred embodiments of the present invention generally includes devices, such as a surface acoustic resonator, a surface acoustic filter, and surface acoustic delay line, which use surface acoustic waves. Each device is provided with at least one IDT disposed on a piezoelectric substrate thereof. The number of IDTs are determined according to the type and use of the device.

According to preferred embodiments of the present invention, a reliable surface acoustic wave device having superior electrical characteristics and resistance to natural phenomena is achieved.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
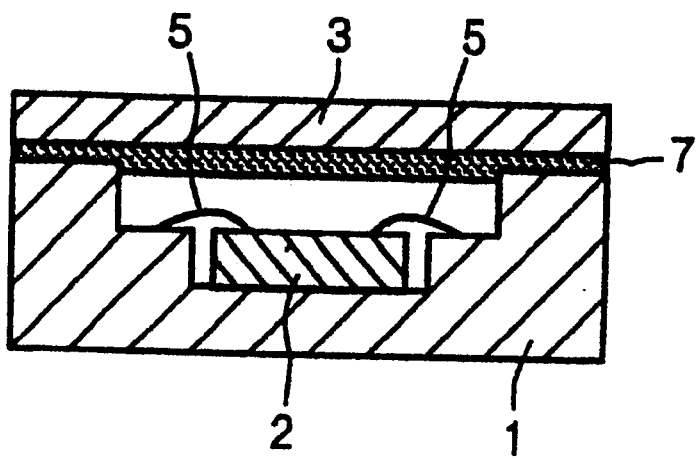
FIG. 1 is a sectional view of a surface acoustic wave device according to a preferred embodiment of the present invention.

FIG. 1 shows in a sectional view the configuration of a surface acoustic wave device according to a preferred embodiment of the present invention.

The surface acoustic wave device according to a preferred embodiment preferably includes a surface acoustic wave element 2 that is sealed in a package defined by a concave base member 1 preferably made of a ceramic such as alumina and a plate-shaped metallic cap member 3 which are joined together. The surface acoustic wave element 2 is bonded and fixed to the inner surface of the concave base member 1 by an adhesive (for example, via die bonding), and is connected to electrodes of the base member 1 by wire-bonding wires 5. The base member 1 and the metallic cap member 3 are bonded and joined with each other preferably via an epoxy-based resin adhesive 7 which is a sealing material.

The metallic cap member 3 is coated with the epoxy-based resin adhesive 7 on the entire surface thereof that is disposed opposite to the base member. A substantially rectangular-frame-shaped upper portion of the base member 1 is bonded to the metallic cap member 3 at the periphery thereof by the epoxy-based resin adhesive 7.

The sealing material is not limited to an epoxy-based resin adhesive, and it may be any other resin adhesive such as an acryl, a urethane, or a silicon, a metal such as a solder or an Au—Sn alloy, or a glass or other suitable material. The sealing material may include a plurality of types of these materials disposed in layers in order to improve adhesion between the base member and the cap member.

The base member 1 preferably has a concave shape which is defined by laminating a plurality of ceramic plates. The base member 1 is provided with electrodes for providing input, output, and grounding on the bottom surface thereof and the inner surface of the concave portion, and inside of the base member 1. The base member may be made of a resin or a metal. When a solder or other suitable material is used as the sealing material, a sealing ring of a metallic film may be disposed at the substantially rectangular-frame-shaped upper portion of the base member so as to improve the adhesion.

The cap member 3 is preferably made by punching a metallic plate of Kovar, an iron-nickel (Fe—Ni) alloy, or other suitable material, and is plated with Au, or other suitable material, as needed, at the surface of the cap member 3. A ceramic or resin substrate processed to be conductive, such as by being plated at the surface thereof, may be used as the cap member.

The base member 1 and the cap member 3 of the surface acoustic wave device are joined in a manner described below. The base member provided with the surface acoustic wave element that is fixed and electrically connected thereto and the metallic cap member 3 are prepared. The metallic cap member 1 is evenly coated with the epoxy-based resin adhesive 7 by screen-printing at one entire major surface of the metallic cap member. Then, it goes through a preliminary drying or curing process. The base member 1 is placed on the cap member 3 across the resin adhesive 7 provided on the cap member 3. The base member 1 and the cap member 3, while being pressed to each other, are heated at a temperature of about 100° C. to about 300° C., and the resin adhesive 7 is cured, thereby joining the base member 1 and the cap member 3. As a result of the heating under pressure, the thickness of the resin adhesive 7 after joining (cured) is greater at the center than at the joining portion, as shown in FIG. 1. The cap member 3 may be disposed over the base member 1 when joining the base member 1 and the cap member 3.

The method of forming the sealing material is not limited to printing, and it may be formed by any other method such as transferring, spraying, coating, or cladding or other suitable method. When a solder, or other suitable material, is used as the sealing material, the sealing material formed thereby goes through a preliminary melting, rinsing, and other such processes, then it is melted by heat in a reflow furnace or other such apparatus, thereby joining the base member and the cap member.

According to preferred embodiments, the entire surface of the cap member disposed opposite to the base member is provided (coated) with the sealing material so that the cap member is covered by the sealing material, whereby metallic particles adhered on the cap member are prevented from adhering to the surface acoustic wave element. The joining interface with the cap member is not exposed in the package. The length of the joining interface and the length of the resin adhesive (sealing material) between the outside and the inside space are large, so that penetration of the outside air, which penetrates from the outside to the inside space, is remarkably reduced and minimized. When gaps are formed by foreign particles and scratches between the base member and the cap member, the sealing material at the center of the cap member is supplied to the joining portion, whereby the adhesive strength and the air-tightness are prevented from decreasing, thereby providing a stable joint having a high level of air-tightness.

A result of a test is described below. The test was performed in order to confirm the operation and the effect of the device according to preferred embodiments of the present invention described above, in which the device according to preferred embodiments of the present invention was compared with a known device.

Defective fractions of the insulation resistance (defective when the resistance was 1 MΩ or less) across the input and the output were compared by using cap members of Kovar plated with Au, in order to compare the difference due to adhered metallic particles. As a result, the defective fraction in the known device was about 0.10%. On the other hand, the defective fraction in the device according to the present invention was about 0.01%. Thus, the insulation resistance defective fraction in the device according to preferred embodiments of the present invention was significantly decreased compared with that in the known device.

A helium leak test was performed by using a solder as the sealing member, in which incipient sealing (air-tightness) defective fractions and sealing defective fractions after thermal shock tests (the test was repeated 2000 times, each time for thirty minutes at −55° C. and thirty minutes at 125° C.) were compared (defective when the leak was 0.001 Pa·cm$^3$/second or more). As a result, the incipient sealing defective fraction was about 2.5% in the known device and about 0.1% in the device according to preferred embodiments of the present invention. The sealing defective fraction after the thermal shock tests was about 0.5% in the known device and about 0.2% in the device according to preferred embodiments of the present invention. The defective fractions before and after the thermal shock tests in the device according to preferred embodiments of the present invention were significantly decreased compared with those in the known device.

Figure 2:
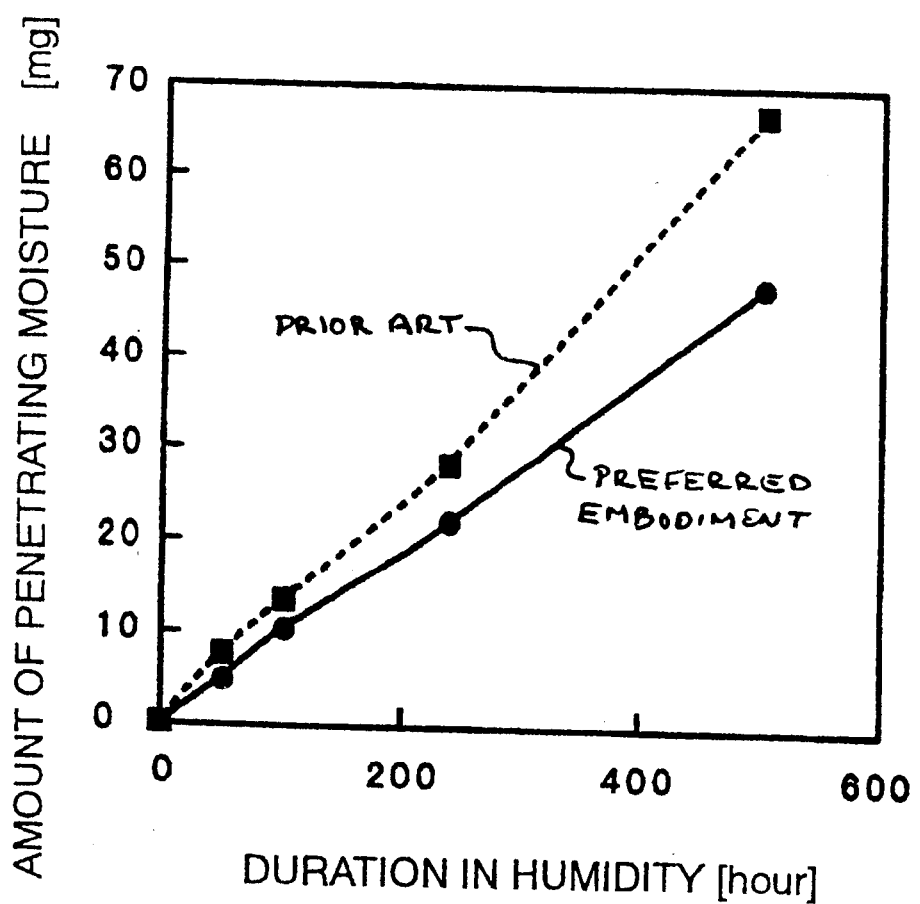
FIG. 2 is a graph showing the relationship between the amount of penetrating moisture and the duration in a moisture-proof test of the device according to preferred embodiments of the present invention and according to a known device.
Figure 3:
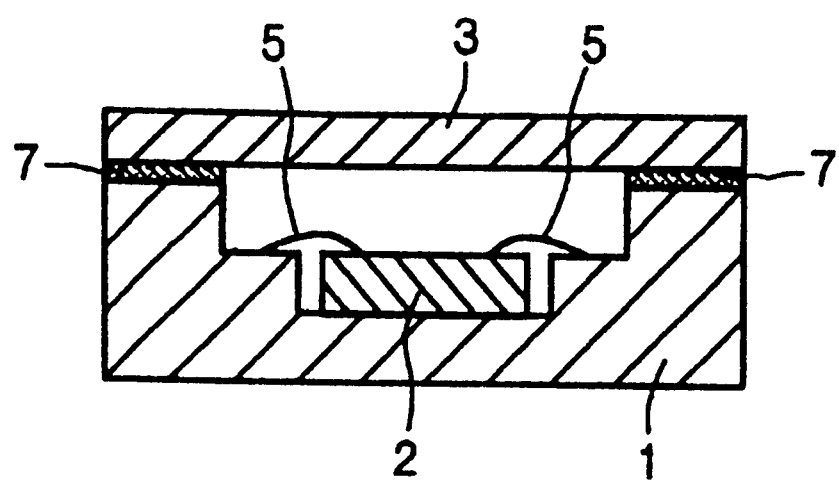
FIG. 3 is a sectional view of a known surface acoustic wave device.

In FIG. 2, results of measuring the volume of moisture penetrating the package using a resin adhesive as the sealing material are shown. The devices used in a moisture-proof test (temperature of 85° C. and relative humidity of 85%) were prepared to have the resin adhesive being a mixture of an epoxy-based resin and an amine-based curing agent, the package having dimensions of approximately 3.0 mm×3.0 mm×1.2 mm, and the joining portion having a width of about 0.4 mm and a thickness of about 10 μm. FIG. 2 is a graph showing the relationship between the exposed time and the amount of moisture penetrating the inside of the device. As shown in FIG. 2, the amount of penetrating moisture in the device according to preferred embodiments of the invention is much smaller than the amount of the same in the known device.

According to preferred embodiments of the present invention, the surface acoustic wave element is fixed to the base member by die bonding, and is electrically connected thereto by wire bonding. The configuration is not limited to that which is described above, and the surface acoustic wave element may be fixed and electrically connected to the base element by bump-joining or other suitable methods.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:

a surface acoustic wave element; and a package arranged to hermetically seal the surface acoustic wave element therein, the package having a base member and a conductive cap member;

a sealing material arranged to join the conductive cap member and the base member;

wherein the conductive cap member is coated with the sealing material on the entire surface thereof that is disposed opposite to the base member such that the base member does not directly contact the conductive cap member.

2. A surface acoustic wave device according to claim 1, wherein the sealing material is a resin adhesive.

3. A surface acoustic wave device according to claim 1, wherein the base member has a substantially concave shape.

4. A surface acoustic wave device according to claim 1, wherein the base member is made of a ceramic material.

5. A surface acoustic wave device according to claim 1, wherein the cap member is a plate-shaped metallic member.

6. A surface acoustic wave device according to claim 1, wherein the surface acoustic wave element is one of a surface acoustic resonator, a surface acoustic filter, and a surface acoustic delay line.

7. A surface acoustic wave device according to claim 1, wherein the sealing material includes one of acryl, urethane, silicon, metal and glass.

8. A surface acoustic wave device according to claim 1, wherein the base member is made of one of a resin and a metal.

9. A surface acoustic wave device according to claim 1, wherein a joining interface between the base member and the cap member is not exposed in the package.

10. A surface acoustic wave device according to claim 1, wherein the surface acoustic wave element is fixed and electrically connected to the base member.

* * * * *